United States Patent [19]

Faria

[11] 4,335,351

[45] Jun. 15, 1982

[54] MOVING MAGNET ELECTRICAL METER WITH SINGLE PIVOT PIN FOR THE MOVING MAGNET AND A FIXED RETURN MAGNET

[76] Inventor: Thomas G. Faria, 17 Park Dr., Waterford, Conn. 06385

[21] Appl. No.: 138,530

[22] Filed: Apr. 9, 1980

Related U.S. Application Data

[62] Division of Ser. No. 892,032, Mar. 31, 1978, abandoned.

[51] Int. Cl.³ .......................... G01R 5/16; G01R 1/04
[52] U.S. Cl. ............................. 324/146; 324/154 PB; 324/155
[58] Field of Search ............... 324/133, 144, 146, 147, 324/149, 154 R, 154 PB, 155; 116/284, 288, 297, 303, 328; 335/222, 272; 340/373

[56] References Cited

U.S. PATENT DOCUMENTS

| | | | |
|---|---|---|---|
| 1,940,521 | 12/1933 | Acosta | 324/133 |
| 2,367,065 | 1/1945 | Sias | 324/146 |
| 2,867,768 | 1/1959 | Fribance et al. | 324/146 |
| 2,968,000 | 1/1961 | Pfeffer | 324/146 |
| 2,978,639 | 4/1961 | Lawson | 324/146 |
| 3,210,758 | 10/1965 | Huston | 324/146 UX |
| 3,460,038 | 8/1969 | Ziegler | 324/146 |
| 3,510,774 | 5/1970 | Bakke et al. | 324/146 |
| 3,522,534 | 8/1970 | Mackenzie | 324/154 PB |
| 3,777,264 | 12/1973 | Erbert | 324/146 |
| 4,047,136 | 9/1977 | Satto | 324/146 X |

Primary Examiner—Gerard R. Strecker
Attorney, Agent, or Firm—Hopgood, Calimafde, Kalil, Blaustein & Judlowe

[57] ABSTRACT

The invention contemplates a moving-magnet meter movement wherein frame structure to pivotally support the moving element also includes coil-supporting bobbin structure, so that a fixedly mounted coil can be wound directly on the frame structure after assembly of all moving parts including the needle pointer of the moving element. The frame structure is also so arranged in laterally offset relation to the bobbin region that terminals with separate terminal-strip elements can project laterally further from the bobbin region and outward of the frame structure, whereby coil lead and/or other circuit-element connections within the meter can be made in laterally projecting regions of the terminal-strip elements, thus enabling a single dip-soldering operation to consolidate all electrical connections. Other features are described.

10 Claims, 11 Drawing Figures

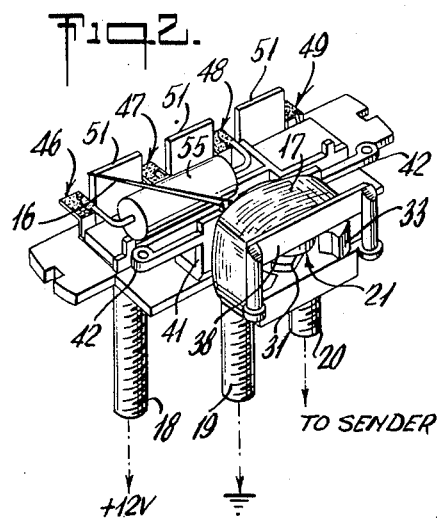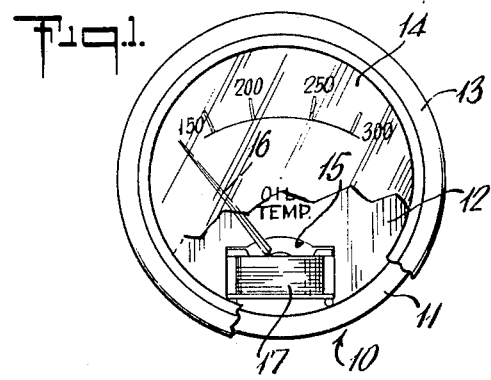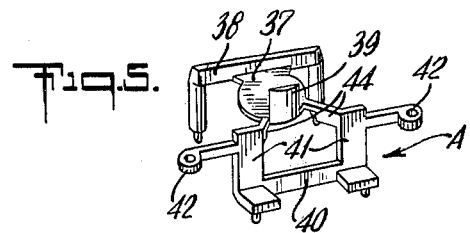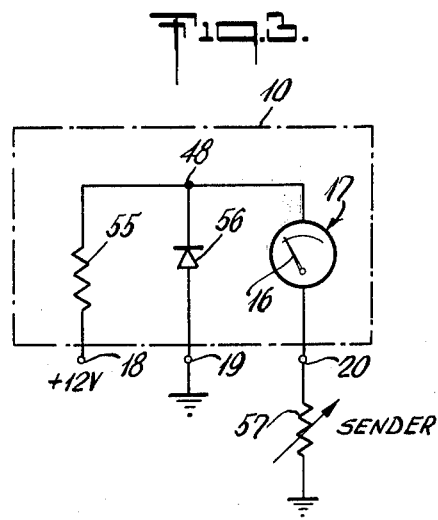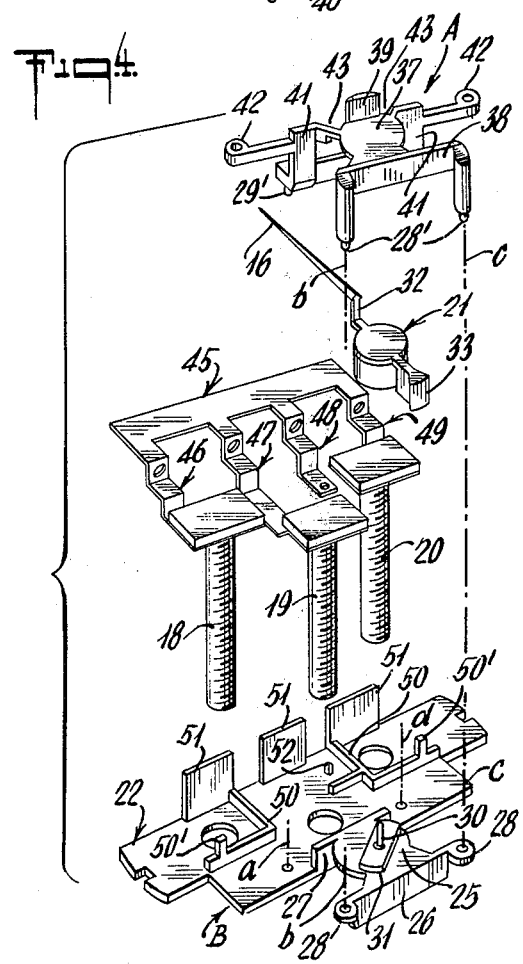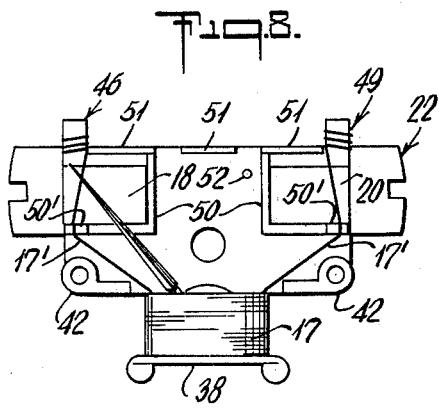

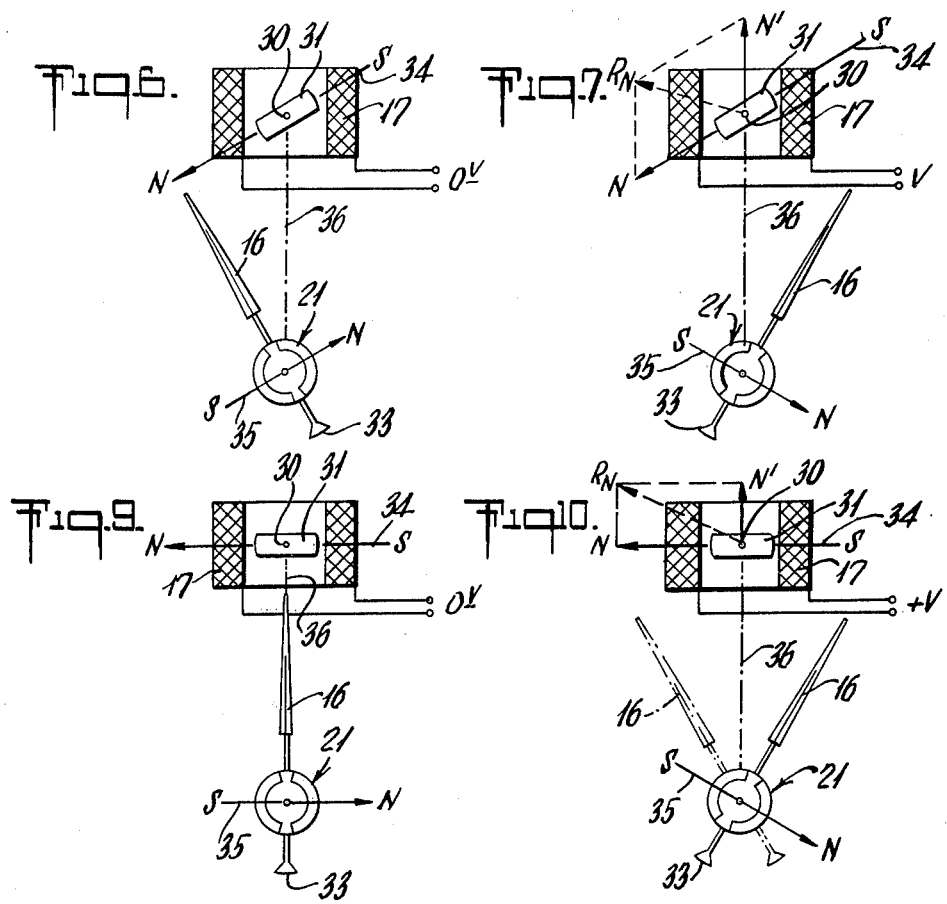
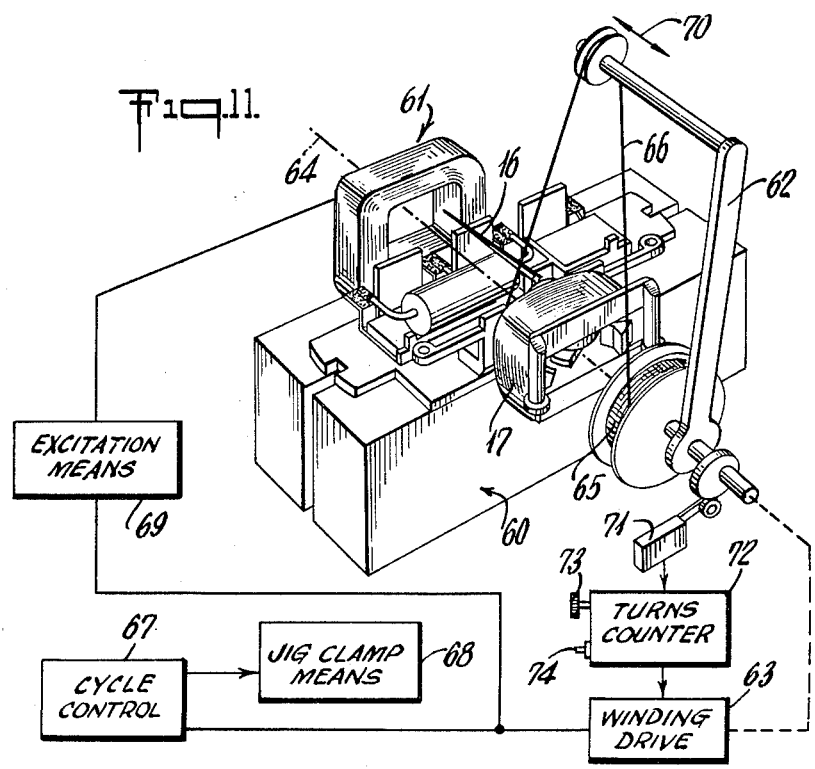

MOVING MAGNET ELECTRICAL METER WITH SINGLE PIVOT PIN FOR THE MOVING MAGNET AND A FIXED RETURN MAGNET

This application is a division of my copending application Ser. No. 892,032, filed Mar. 31, 1978, now abandoned.

The invention relates to the construction and method of assembly of electrical meters of the moving-magnet variety, employing a fixed coil for acceptance of the electrical input which is to determine movement of an indicator needle or the like.

Electrical meters of the character indicated find greater use in automotive vehicles and serve a variety of purposes, as for example, voltmeters, ammeters, fuel-gauges, oil-temperature indicators, etc. And the need has always existed for accuracy and reliability, consistent with low cost and prolonged operation in an environment which is often abusive.

It is an object of the invention to provide an improved meter construction which inherently provides a better response to the above-stated needs.

A specific object is to meet the above object with a construction which permits assembly of all moving parts prior to coil winding.

Another specific object is to provide an improved meter of the indicated character wherein fixed-coil development is necessarily in closely coupled relation with and surrounds the moving-magnet element.

It is also a specific object to meet the last-stated object with a meter in which the movement is automatically returned to a calibrated at-rest position in the absence of coil excitation.

A further specific object is to provide a basic meter construction of the character indicated and serving for the assembly of a variety of different kinds of indicating instruments.

A still further specific object is to provide improved terminal structure in a meter of the character indicated, enabling simpler and inherently more accurate mass-produced assembly of such meters.

Another specific object is to provide improved apparatus for use in assembling meters of the character indicated.

Other objects and various further features of novelty and invention will be pointed out or will occur to those skilled in the art from a reading of the following specification, in conjunction with the accompanying drawings. In said drawings, which show, for illustrative purposes only, preferred forms of the invention:

FIG. 1 is a plan view of a meter of the invention, with parts broken-away to reveal some internal structure;

FIG. 2 is a perspective view of the assembled moving-magnet movement and associated frame structure, for the meter of FIG. 1;

FIG. 3 is a circuit diagram to show the electrical relation of components within and external to the meter of FIGS. 1 and 2;

FIG. 4 is an exploded view in perspective of mechanically related parts of FIG. 2;

FIG. 5 is a perspective view of one of the parts of FIG. 4, viewed from the opposite aspect;

FIGS. 6 and 7 are similar diagrams schematically indicating unexcited and excited conditions of the coil in the meter of FIG. 1;

FIG. 8 is a plan view of a meter movement incorporating structure of FIG. 4 in a modified arrangement;

FIGS. 9 and 10 are diagrams similar to FIGS. 6 and 7 to illustrate modifications; and FIG. 11 is a simplified view in perspective to schematically show apparatus used in a part of the assembly procedure for the meter of FIG. 1.

The illustrative meter of FIG. 1 is an oil-temperature gauge contained within a cylindrically cupped housing 10 having an outward flange 11 at its open end. A suitably inscribed face plate 12 is angularly keyed to housing 10, being retained (by means not shown) in spaced relation above the closed end of the housing and also at an elevation beneath the level of flange 11, apertures (not shown) being provided in the closed end of housing 10 for passage and securing of terminal bolts, to be described. A retaining ring 13 is peripherally rolled into permanent engagement with and over flange 11 and retains a cover glass or lens 14 against flange 11. At a localized region beneath the inscribed area, the face plate 12 is cut out (at 15) to accommodate the indicating-needle arm 16 and portions of coil (17) and bobbin structure of the meter movement, the latter being more fully shown and described in conjunction with FIGS. 2 to 7.

Basically, and in accordance with a feature of the invention, the fixed coil 17 is wound upon a multiple-part bobbin which is itself part of the frame used for mounting a plurality of terminals 18-19-20 and certain electrical-lead connections thereto, the moving-magnet hub 21 of the indicator needle 16 being fully assembled to the frame structure prior to coil-winding direct to the bobbin. In the form shown, the number of bobbin parts is two, designated as upper part A and lower part B in FIG. 4, and each of these parts is preferably of single-piece unitary injection-molded plastic construction; the lower part B is shown to be integrally formed with a terminal-mounting base 22, and coacting pin-and-socket formations at four corners of the bobbin-defining portions of parts A and B are shown on the respective insertion alignments a-b-c-d.

In essence, each of the bobbin-defining parts A-B establishes one of two spaced elongate channels. The bases of the channels are in spaced back-to-back relation, with their respective sidewalls extending outwardly of the bases, to define open troughs in which coil-winding turns are confined. More specifically, the channel of the lower-bobbin part B comprises a flat base 25 connecting an outer sidewall 26 and an inner sidewall 27, the latter providing the integral connection with the terminal-mounting base 22. Sockets or apertures 28 on the alignments b-c provide stabilizing connection of the ends of wall 26 to registering pin formations 28' on part A; and similar sockets or apertures 29 on alignments a-d provide further connection of base 22 to registering pin formations 29' on part A. Securely and centrally mounted upon base 25 is an upstanding needle-pivot pin 30 and a permanently polarized "return-magnet" element 31, a preferred technique being to provide pin 30 with a seating flange near its base end so that its lower end can extend through aligned openings in element 31 and base 25, the parts being staked and the lower end of pin 30 being peened to retain their assembled relationship.

My preferred meter constructions involve single-point suspension of the indicator needle 16. To this end, the hub 21 has a downwardly open bore which freely pivotally accommodates the pin 30, and the latter has a conically pointed end upon which the bottom of the hub bore rests. As will be later explained, the hub 21 may include a permanently magnetized annulus of suitable material, and the length of pin 30 in relation to the bore of hub 21 is such as to establish a slight clearance between adjacent surfaces of the hub and of the return magnet, thereby enabling the axial force of magnetic attraction between hub 21 and return-magnet 31 to retain and lightly load the single-point suspension. As shown, the indicator-needle arm 16 is axially offset at 32 from its hub region 21, and a counterweight portion 33 thereof extends a short distance diametrically opposite to the pointer arm 16.

The described indicator needle 16 including its magnetized hub is not only fully assembled but is also permanently magnetized, prior to assembly into the described single-point suspension. For the meter of FIG. 1, wherein the at-rest position of indicator needle 16 is at the left end of its range of pivoted movement, FIG. 6 illustrates at 34 a permanent-polarization axis of the fixed magnet 31, and a permanent-polarization axis 35 of the hub 21. Axis 34 is through the pivot-pin axis and is at substantial angular offset from the axis 36 of flux development due to excitation of coil 17. The axes 34-36 intersect at the pivot-pin axis, which, as noted above is also central of the channel base 25 and therefore at or substantially at the longitudinal center of the axis of development of coil 17. In the at-rest or unexcited condition of FIG. 6, the hub magnet pivotally aligns its polarization axis 35 in opposed registration with the fixed axis 34, where a vector N denotes the return-magnet flux; and FIG. 7 shows that when coil 17 is excited with a d.c. voltage V to produce flux (denoted N') in the direction of axis 36, the hub 21 tracks the resultant $R_N$ of flux vectors N—N', to yield a readable displacement of needle 16, the extent of such displacement being a linear function of the magnitude of coil excitation.

Returning to FIGS. 4 and 5, the upper part A of the bobbin structure is seen also to comprise an elongate channel defined by a central bases 37 integrally connecting upstanding outer and inner sidewalls 38–39. Corner legs integral with the upper bobbin channel are characterized by the locating-pin formations 28'–29' already described, and an integrally formed tie bar 40 connects the lower ends of the inner pair (41) of these legs, thereby defining a relatively rugged open rectangular frame through which the needle arm 16 extends and within which ample clearance is available for the full range of needle movement. Side arms 42 with end apertures provide for anchored support of an indicator face 12, as may be needed for certain application requirements.

It is a feature of the invention that coil 17 is wound in closely coupled circumferential overlap with both the fixed and movable magnets and that its general plane of winding symmetry shall include the axis of pivot pin 30. In this circumstance, the magnetic vectors 34-35-36 intersect centrally within coil 17 at the pivot axis, and in a plane which is normal to the pivot axis. For close coupling, the longitudinal extent of the bases 25–37 is minimized, by arcuate contouring of the ends of bases 25–37 at a radius about the pivot axis to provide close clearance between the needle hub 21 and inner turns of the coil 17. Still further, to provide maximum displayable length of the needle arm 16, the offset 32 is preferably at relatively short radius about the pivot axis, and to permit a maximum range of needle motion in this circumstance, the upstanding back surface of sidewall 39 is cylindrically arcuate (see FIG. 5) and base 37 is locally cut away at 43, adjacent strut connections 44 to legs 41.

In view of the self-retaining nature of the described single-point suspension of the pivoted needle, the vertical offset or spacing between bases 25–37 need only be enough to assure running clearance between base 37 and the upper surface of the hub region of needle 16. This consideration favors the indicated preference for close coupling of coil 17 to the indicated flux vectors. And it will be understood that in the process of applying conventional winding techniques to the assembly of bobbin parts A and B (with a fully assembled needle 16 captively suspended therewithin), the coil winding necessarily retains the assembly without requiring adhesive, staking or any other fastening technique at the pin-and-socket engagements 28—28' and 29–29'.

It has been indicated that the meter construction of FIGS. 1 to 7 is basically applicable to instruments other than the depicted oil-temperature gauge. To this end, the terminal-mounting base 22 embodies certain further features of the invention, notable among which is a severable terminal-strip construction which facilitates automated handling and assembly, including provision for a single-step solder-dipping operation to consolidate all internal electrical connections, regardless of the particular variety of instrument that is being constructed. The terminal strip (prior to the severing operation) is identified 45 in FIG. 4 and is shown initially to comprise an elongate conductive strip as of copper, with integral individual branch strips 46-47-48-49 at four longitudinally spaced locations. The branch strips are bent in similarly stepped configuration, and their outer ends are horizontal, for mounting to the upper surface of the mounting base 22. The flat outer ends of the outer branch strips 46–49 are contoured to match the rectangular contour of enlarged heads of the terminal bolts 18–20, being apertured and staked or otherwise conductively fastened beneath the respective terminal bolt heads. It will be understood that when fully assembled to base 22, the outer ends of branch strips 46–49 are also compressed between such bolt heads and the adjacent surface of base 22, such compression deriving from the permanent (nut-secured) fastening of bolts 18–20 to mounting apertures in the closed end of housing 10. It will also be understood that when thus mounted, the bolt heads are within stiffening-rib alignments 50 in the upper surface of base 22, and that all such branch strips locate between upstanding side flanges 51 integral with and along the straight longitudinal edge of base 22.

In a manner similar to that described for branch strips serving terminals 18–20, intermediate branch strip 47 is shown conductively staked, compressed and electrically connected to the head end of terminal 19, customarily reserved for ground connection as suggested by symbolism in FIGS. 2 and 3. Finally, the branch strip 48 is merely fastened to the insulating base 22, as via an integral upstanding stud formation 52 (FIG. 8) passing through the apertured end of strip 48 and deformed into permanent retaining relation with base 22. It will be understood that, once bolts 18-19-29 have been staked or otherwise permanently subassembled to the respective branches 46-47-49 of terminal strip 45, these bolts are passed through spaced openings provided for them in the base 22, whereby subassembly is retained by securing branch strip 48 at 52. The severable interconnection may thereafter be maintained throughout assembly operations, up to the time for assembling circuit-element lead connections to the branch strips, as variously called for in different instrument applications.

For example, in the depicted oil-temperature guage, wherein a dropping resistor 55 and a Zener diode 56 are series-connected across a d.c. source (terminal 18) to ground (terminal 19), the "insulated" branch strip 48 is utilized for the connection of circuit elements 55-56, and the branch strips 48-49 are utilized for connection of the respective lead-wire ends of coil 17. Thus wired, and with terminal 20 connected to a grounded "sender" 57 such as a thermistor element exposed for response to oil temperature, the Zener diode 56 provides a constant-voltage source across which the IR drops of the coil 17 and the "sender" 57 are continuously presented. As "sender" resistance varies (inversely) with changing oil temperature, the needle deflection at 16 will always be a direct measure of temperature-indicative current through or voltage across coil 17.

Since resistor 55 is so much longer and larger than Zener diode 56, the latter is hidden from view in FIG. 2. But diode 56 will be understood to be nested in the cove between base 22 and the central flange 51, with its respective leads bent parallel and passing through the spaces between flanges 51 and initially also through the lead apertures provided in vertically bent portions of branch strips 47-48. In similar fashion, the leads of resistor 55 are bent parallel and pass through lead apertures in branch strips 46-48. Once elements 55-56 are thus initially assembled, the lead-aperture regions of strips 45-46-47-48 may be crimped into conductive and retaining relation and the interconnecting-bar portion of terminal strip 22 may be severed, thus establishing the electrical independence of each of strips 45-46-47-48, the crimped ends of all of which project beyond and clear of the adjacent edge of base 22, i.e., beyond flanges 51. Coil leads may then be wound around the outwardly projecting ends of branch strips 48-49, and in one hot-dip soldering operation all the projecting strip ends and their lead connections may be simultaneously consolidated, it being noted that in the described orientation of the strip projections (beyond flanges 51), the solder dip is necessarily performed with coil 17 parallel to and offset to a maximum from the surface of the liquid solder.

The foregoing description of the oil-temperature gauge of FIG. 1 will be recognized also as a description of the basic meter movement as a low-range voltmeter or as a milliammeter, depending upon how one views its response to the IR drop across or current (I) through coil 17. And of course the additional elements 55-56 and their interconnection were provided for the special-purpose function described. Thus, for purely voltmeter or purely ammeter functions, the construction may be simplified, as illustrated in FIG. 8, wherein many of the already described parts will be recognized from the same reference numbers. For such simplified purposes only two terminal stud bolts are needed, these being bolts 18-20, and the wire-lead ends 17' of coil 17 are wrapped and soldered to the branch strips 46-49 serving these two stud bolts; it will be noted from the dog-leg course of both these lead ends in FIG. 8 that short upstanding lugs 50' in reinforcement ribs 50 enable precise, taut and symmetrical coursing of the lead ends to strips 46-49, well clear of needle movement. The third stud bolt 19 serves purely for additional anchorage and may in many cases be omitted, if permitted by customer specification. The simplified construction of FIG. 8 will be seen to serve voltmeter functions and/or milliammeter functions when using a coil 17 of relatively large numbers of turns of relatively fine-gauge wire. And for ammeter purposes, a substantially reduced number of turns of relatively heavy-gauge wire is provided at 17; for example, an ammeter having a 0-5 ampere indicating range may utilize a coil 17 having five turns of #18 wire.

FIGS. 9 and 10 will be recognized for their similarity to FIGS. 6 and 7, and therefore the same reference numbers continue to be used. In FIGS. 9 and 10, the meter movement is, however, designed for an at-rest or zero-indicating position at the center of the range of needle movement. Thus, the return magnet 31 and its polarization axis 34 are oriented normal to the axis 36 of coil-developed flux. This being the case, with zero excitation at coil 17 (FIG. 9), the needle-hub polarization axis 35 is drawn into 180°-opposition alignment with the fixed polarization axis 34, placing needle 16 in its center position; and in the presence of coil excitation of one polarity to establish a flux vector N', the resultant $R_N$ tilts the tracking alignment of the needle-hub polarization axis 35 and needle to the right of the at-rest position (solid outline), while coil excitation of opposite polarity will tilt needle 16 in the opposite direction (phantom outline).

FIG. 11 illustrates in simplified and schematic manner the preferred technique for performing the coil-winding step of manufacturing a meter of the invention. At this stage, the complete needle assembly and bobbin parts A-B will have been assembled, the terminal strip 45 will have been severed, and the terminal bolts 18-19-20 will have been assembled to base 22; and these bolts and base 22 provide a means of accurately supporting and orienting the bobbin assembly in jig means 60. If the meter is of a variety having an at-rest needle position other than at the center of its range of movement, then a coil 61 fixed to jig 60 is excited to develop a flux vector (on the coil-winding axis of the bobbin) sufficient to deflect needle 16 to its center position, thus developing maximum lateral clearance between the needle offset 32 and any winding turns laid into the channel confines of the bobbin.

The winding mechanism is shown schematically to include a winding arm 62 (e.g., a "fly winder") with means 63 for driving the same in rotation about the alignment of the coil-winding axis 64, through the center of the bobbin opening, and normal to the general plane of winding turns. The outer end of arm 62 has pulley, eye or the like wire-guide means which courses a circumferential path around the bobbin. As shown, a supply spool 65 of coil wire 66 (e.g., of suitable-gauge copper, and suitably coated for insulation and self-fluxing in the circumstance of the described hot-dip soldering operation) is positioned on the axis 64, for lightly dragging pay-out in the course of rotation of arm 62. The operation may proceed in a semi-automatic cycle controlled at 67, once the free end of wire 66 is threaded via the guide of arm 62, around at least part of the bobbin and over base 22, to a wrap at one of the branch strips 46-47-48-49. The control 67 will be understood to provide suitable sequencing control of jig-clamp means 68 and needle-deflecting excitation means 69, prior to initiating the drive of winding arm 62; and a double-arrow 70 will be understood to suggest the traversing action of the winder to develop a uniform lay-up of coil turns within the width of the bobbin-channel confines. A limit switch 71 operates once per rotation of arm 62 to count winding turns, and turns-counting means 72 responds to impulses from switch 71 to stop the winding drive at 63 upon achievement of a preselected number of turns of coil 17, such preselection and reset for the next coil-winding operation being suggested at 73–74, respectively. When a coil winding is completed, the wire 66 is severed after wrapping the remaining lead end at the particular desired one of the branch strips 46 to 49.

It will be seen that the described invention meets all stated objects and provides inherently simple and precise instruments which may involve various optional functional forms and which lend themselves to manufacture with a substantial degree of automation. Important to the achievement of such results is the selection of magnetic materials and the separately jigged subassembly and polarization (a) of the needle 16 with its magnetic hub 21 and (b) of the bobbin part B with its return magnet 31 and pivot pin 30. For example, the pointer magnet at hub 21 is normally a cylindrically annular magnet of suitable ceramic or barium ferrite, with a high coercive force, preferably over 1,500 oersteds; and the return magnet 31 has a coercive force which is approximately $\frac{1}{3}$ that of the magnet at 21, and preferably with a coercive force of 500 oersteds or more. The magnet material known as cunife is well suited to return-magnet purposes, for having the desired coercive force. The return magnet 31 must have a high enough coercive force that it is not demagnetized by the field of the coil. Its coercive force, however, must be lower than that of the pointer-hub magnet at 21, so that an external high magnetic field can be used to calibrate the finished meter.

In production, at the subassembly level, the needle 16 with its annular magnetizable hub 21 cemented thereto is placed into a magnetizing fixture which magnetizes the pointer magnet at the desired angle. And in a separately jigged subassembly, the return magnet 31 and pivot 30 are secured to the lower bobbin part B, at 25; the jig fixture for this operation not only positions the return magnet at its desired angle but also magnetizes it at its desired angle. Both these subassembly operations will have fully charged the magnet structures involved. Later on, after full assembly of the movement (FIG. 2), the instrument is calibrated by passing a calibration-level current through coil 17, and the meter will read low because of the fully charged magnet structures. The calibration is completed by then applying an external a.c. or d.c. magnetic field to the entire assembled movement, to degauss the return magnet to the point at which the needle 16 is seen to advance to its correct reading. In the course of this degaussing operation, the pointer magnet at 21 remains relatively unaffected by the external calibrating degaussing field, due to the higher coercive force of the pointer magnet.

While the invention has been described in detail for the preferred forms shown, it will be understood that modifications may be made without departing from the scope of the invention.

What is claimed is:

1. In a moving-magnet electrical meter, comprising a frame and movable indicator means having an indicator portion and a permanently magnetized hub portion, said hub portion being pivotally mounted to said frame, a polarized return magnet carried by said frame, and a coil fixedly carried by said frame and surrounding both said magnetized hub portion and said return magnet, the improvement (a) wherein said frame comprises separate upper and lower single-piece bobbin parts one of which is integrally formed with a terminal-mounting base portion, each of said parts including a portion defining a bobbin channel and said parts having coacting spacing and location formations which cooperatively position said channels in spaced parallel relation with side walls of the respective channels extending in opposite directions, whereby said one part may constitute a chassis for initial assembly of terminal and other elements thereto when the bobbin channel thereof is facing downward, (b) wherein terminal elements are assembled to said mounting base portion, and said return magnet and an upstanding pivot pin are mounted to the base of the bobbin channel of said one part, (c) wherein said hub portion has a pivot bore of limited depth, said pin locating in said bore and positioning said hub portion in close clearance with said return magnet, (d) said other part being fitted to said one part with the channel base thereof in close clearance relation with said hub portion, and (e) wherein said coil holds the assembled relation of said parts, with the turns of the coil received and located by and between the sidewalls of said channels, the respective ends of the coil having electrical connection to different terminal elements, said terminal-mounting base portion having an elongate edge parallel to and laterally offset from the associated bobbin-channel portion; each said terminal element comprising a headed bolt seated on said mounting base portion and extending therethrough, a terminal-strip element secured to the headed end of said bolt and projecting laterally outwardly of said edge, and a coil-end connection wrapped around and soldered to the outwardly projecting end of each of two of said strip elements.

2. The electrical meter improvement of claim 1, in which said indicator portion is a needle extending radially of said hub portion, and in which said coacting spacing and locating formations include two legs integrally formed with one of said channels at angularly opposite sides of said indicator needle and at an angular spacing to clear both limits of the range of coil-actuable movement of said needle.

3. The electrical meter improvement of claim 2, in which registering pin-and-socket means on said legs and on the other channel engage for positional retention.

4. The electrical meter improvement of claim 1, in which a separate circuit element is additionally carried by said mounting base portion, said circuit element having two leads one of which is connected to the soldered region on one of said wrapped terminal-strip elements and the other of which is connected to the outwardly projecting end of the third of said strip elements.

5. The electrical meter improvement of claim 4, in which all connections to the respective terminal strips are in a single alignment external to said edge, whereby soldering of such connections may be performed in a single hot-dip operation.

6. The electrical meter improvement of claim 5, in which all of the respective terminal strips are severed parts of the same single terminal strip blank, said strips being initially retained by a common elongate connection strip which initially interconnects said strips at said single alignment, whereby all bolt assemblies may be made to said base and strip blank prior to severance along said alignment.

7. The electrical meter improvement of claim 1, each of said channels being symmetrically disposed with respect to a central plane which includes the pivot-pin axis.

8. The electrical meter improvement of claim 1, in which said indicator portion is a needle comprising a pointer arm extending radially from said hub portion and having a range of angular movement through one of the open ends of said coil, that sidewall of said other channel which is adjacent said one open end being of substantially less longitudinal extent than the base of said other channel, the outer surface of said last-mentioned sidewall being cylindrically arcuate about the pivot-pin axis and at a radius which radially clears the hub portion of said needle, said pointer arm including an axially upward offset positioning the radially outer remainder of said arm above the elevation of the base of said other channel, said offset being in radial-clearance proximity to said cylindrically arcuate surface, the base of said other channel being locally recessed at juncture with the longitudinal ends of said sidewall, whereby a wide angular range of indicator-needle movement can be accommodated with a relatively great length of said pointer arm at said offset elevation.

9. In a moving-magnet electrical meter, comprising a frame and movable indicator means having an indicator portion and a permanently magnetized hub portion, said hub portion being pivotally mounted to said frame, a polarized return magnet carried by said frame, and a coil fixedly carried by said frame and surrounding both said magnetized hub portion and said return magnet, the improvement (a) wherein said frame comprises separate upper and lower single-piece bobbin parts one of which is integrally formed with a terminal-mounting base portion, each of said parts including a portion defining a bobbin channel and said parts having coacting spacing and locating formations which cooperatively position said channels in spaced parallel relation with side walls of the respective channels extending in opposite directions, whereby said one part may constitute a chassis for initial assembly of terminal and other elements thereto when the bobbin channel thereof is facing downward, (b) wherein terminal elements including spaced conductive strips are assembled to said mounting base portion, and said return magnet and an upstanding pivot pin are mounted to the base of the bobbin channel of said one part, (c) wherein said hub portion has a pivot bore of limited depth, said pin locating in said bore and positioning said hub portion in close clearance with said return magnet, (d) said other part being fitted to said one part with the channel base thereof in close clearance relation with said hub portion, and (e) wherein said coil holds the assembled relation of said parts, with the turns of the coil received and located by and between the sidewalls of said channels, the respective ends of the coil having electrical connection to different terminal strips, all of the respective terminal strips being severed parts of the same single terminal strip blank, said strips being initially retained by a common elongate connection strip which initially interconnects said strips at said single alignment, whereby all further terminal assembly may be made to said base and strip blank prior to severance along said alignment.

10. The electrical meter improvement of claim 9, in which the base of both channels are longitudinally coextensive, and in which the longitudinal ends of the bases of both channels are arcuate to the same radius about the pivot axis.

* * * * *